(12) United States Patent
Choi et al.

(10) Patent No.: US 7,773,166 B2
(45) Date of Patent: Aug. 10, 2010

(54) ORGANIC THIN FILM TRANSISTOR AND METHOD OF MANUFACTURING THE ORGANIC THIN FILM TRANSISTOR, AND DISPLAY APPARATUS USING THE SAME

(75) Inventors: Nack Bong Choi, Uiwang-si (KR); Min Joo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 782 days.

(21) Appl. No.: 11/638,384

(22) Filed: Dec. 14, 2006

(65) Prior Publication Data

US 2007/0242180 A1    Oct. 18, 2007

(30) Foreign Application Priority Data

Apr. 17, 2006    (KR) .................... 10-2006-0034446

(51) Int. Cl.
   *G02F 1/136*    (2006.01)
(52) U.S. Cl. .......................... 349/43; 349/42
(58) Field of Classification Search ............ 349/42, 349/43
   See application file for complete search history.

(56) References Cited

U.S. PATENT DOCUMENTS

| 7,601,567 B2* | 10/2009 | Suh et al. ............... 438/149 |
| 2005/0170550 A1* | 8/2005 | Seki et al. .............. 438/73 |
| 2006/0030067 A1* | 2/2006 | Huang et al. ............. 438/99 |
| 2007/0040169 A1* | 2/2007 | Kim et al. ............... 257/40 |
| 2007/0090362 A1* | 4/2007 | Ahn et al. ............... 257/66 |
| 2007/0109457 A1* | 5/2007 | Song et al. .............. 349/44 |
| 2007/0134857 A1* | 6/2007 | Suh et al. .............. 438/149 |
| 2009/0152561 A1* | 6/2009 | Yoon et al. ............. 257/72 |

* cited by examiner

Primary Examiner—Julie-Huyen L Ngo
(74) Attorney, Agent, or Firm—McKenna Long & Aldridge

(57) ABSTRACT

Provided are an organic semiconductor structure and a method of manufacturing the same, an organic thin film transistor (OTFT) using the organic semiconductor structure and a method of manufacturing the OTFT, and a display apparatus using the same. The OTFT includes: an oxide layer formed on a base substrate; a source electrode on the oxide layer, wherein the source electrode includes a first source electrode portion and a second source electrode portion; a drain electrode on the oxide layer, wherein the drain electrode includes a first drain electrode portion and a second drain electrode portion; an organic layer pattern having an opening that exposes the first source electrode portion and the first drain electrode portion; an organic semiconductor pattern electrically connected to the first source electrode portion and the first drain electrode portion through the opening, wherein the organic semiconductor pattern has a conductive or an insulating property depending on an applied electric field in a location; a gate insulating layer covering the organic semiconductor pattern; and a gate electrode formed on the gate insulating layer corresponding to the organic semiconductor pattern.

4 Claims, 4 Drawing Sheets

ORGANIC THIN FILM TRANSISTOR AND METHOD OF MANUFACTURING THE ORGANIC THIN FILM TRANSISTOR, AND DISPLAY APPARATUS USING THE SAME

This application claims the benefit of Korean Patent Application No. 10-2006-0034446, filed on Apr. 17, 2006, which is hereby incorporated by reference for all purposes as if fully set forth herein.

BACKGROUND OF THE INVENTION

1. Field of the Invention

The present invention relates to an organic thin film transistor and a method of manufacturing the organic thin film transistor, and a display apparatus using the organic thin film transistor.

2. Discussion of the Related Art

Recently, with the development of semiconductor technology, it is possible to manufacture a very small-sized switching devices such as a thin film transistor (TFT). In addition, the development of the TFT technology accelerates research and development for display devices capable of displaying full-color images, such as liquid crystal display (LCD) devices, organic light emitting diode (OLED) displays, plasma displays (PDP), or the like.

Furthermore, flexible display devices have been developed with a display screen that can be bent and straightened.

In order to manufacture such a flexible display device, a flexible plastic substrate is used instead of a glass substrate, and an organic thin film transistor (OTFT) containing an organic semiconductor is employed instead of a switching device containing an inorganic material.

In manufacturing a related art OTFT, thin source and drain electrodes are formed on a substrate. Thereafter, an organic semiconductor layer is formed on the substrate to cover the source and drain-electrodes. Subsequently, a gate insulating layer is formed to cover the organic semiconductor layer, and a gate electrode is then formed on the gate insulating layer.

However, the organic semiconductor layer of the related art OTFT is damaged during a developing process for developing a photoresist film formed on the organic semiconductor layer and an ashing process and/or a strip process for removing a photoresist pattern formed on an organic semiconductor pattern.

SUMMARY OF THE INVENTION

Accordingly, the present invention is directed to an organic thin film transistor and a method of manufacturing the organic thin film transistor, and a display apparatus using the same that substantially obviates one or more problems due to limitations and disadvantages of the related art.

An advantage of the present invention is to provide an organic thin film transistor (OTFT) enhancing electrical characteristics of the OTFT.

Another advantage of the present invention to provide a method of manufacturing the OTFT.

Still another advantage of the present invention is to provide a display device having the organic thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an OTFT (organic thin film transistor) includes: an oxide layer formed on a base substrate; a source electrode on the oxide layer, wherein the source electrode includes a first source electrode portion and a second source electrode portion; a drain electrode on the oxide layer, wherein the drain electrode includes a first drain electrode portion and a second drain electrode portion; an organic layer pattern having an opening that exposes the first source electrode portion and the first drain electrode portion; an organic semiconductor pattern electrically connected to the first source electrode portion and the first drain electrode portion through the opening, wherein the organic semiconductor pattern has a conductive or an insulating property depending on an applied electric field in a location; a gate insulating layer covering the organic semiconductor pattern; and a gate electrode formed on the gate insulating layer corresponding to the organic semiconductor pattern.

In another aspect of the present invention, a method of manufacturing an OTFT, the method includes: forming an oxide layer on a base substrate; forming hydrophobic source and drain electrodes on the oxide layer, wherein the source electrode is spaced apart from the drain electrode; forming a hydrophobic organic layer pattern having an opening on the base substrate, the opening exposing portions of the source and drain electrodes, respectively; treating the hydrophobic exposed portions of the source and drain electrodes so as to form a hydrophilic source electrode portion in the source electrode and a hydrophilic drain electrode portion in the drain electrode; forming a hydrophilic organic semiconductor pattern electrically connected to hydrophilic source electrode portion and the hydrophilic drain electrode portion through the opening; forming a gate insulating layer covering the hydrophilic organic semiconductor pattern; and forming a gate electrode on a predetermined portion of the gate insulating layer corresponding to the organic semiconductor pattern.

In a further aspect of the present invention, a display device includes: a first display substrate including; an oxide layer formed on a first base substrate; a source electrode on the oxide layer, wherein the source electrode includes a first source electrode portion and a second source electrode portion; a drain electrode on the oxide layer, wherein the drain electrode includes a first drain electrode portion and a second drain electrode portion; an organic layer pattern having an opening that exposes the first source electrode portion and the first drain electrode portion; an organic semiconductor pattern electrically connected to the first source electrode portion and the first drain electrode portion through the opening, wherein the organic semiconductor pattern has a conductive or an insulating property depending on an applied electric field; a gate insulating layer covering the organic semiconductor pattern; and a gate electrode formed on the gate insulating layer in a location corresponding to the organic semiconductor pattern; a second display substrate formed on a second base substrate that is opposite to the first base substrate, wherein the second display substrate includes a color filter formed on a predetermined portion of the second base substrate corresponding to the pixel electrode; and a liquid crystal layer interposed between the first and second display substrates.

In another aspect of the present invention, provided an OTFT (organic thin film transistor) includes: an oxide layer formed on the base substrate; a source electrode formed on the oxide layer; a drain electrode on the oxide layer, wherein the drain electrode is spaced apart from the source electrode; an organic layer pattern having an opening that exposes a portion of the source electrode and the drain electrode; an organic semiconductor pattern contacting both the source electrode and the drain electrode through the opening, wherein the organic semiconductor pattern has a conductive or an insulating property depending on an applied electric field; a gate insulation layer covering the organic semiconductor pattern; and a gate electrode formed on the gate insulating layer at a location corresponding to the organic semiconductor pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to an embodiment of the present invention, examples of which is illustrated in the accompanying drawings.

An organic thin film transistor and a method of manufacturing the organic thin film transistor, and a display apparatus using the same according to preferred embodiments of the present invention will be described below in more detail with reference to the accompanying figures. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers (films), regions and patterns are exaggerated for clarity of illustration of the present invention. In the present invention, it will also be understood that when a substrate, a layer (or film), a region, a pattern or a structure is referred to as being 'on' or 'over' another substrate, another layer (or film), another region, another pad or another pattern, it may be directly on the layer (or film), the region or the pattern, or intervening layers may also be present. Further, it will be understood that when a substrate, a layer (or film), a pattern or a structure is referred to as being 'under' another substrate, layer (or film), pattern or structure, it can be directly under it, and one or more intervening layers may also be present. In addition, a layer (or film), a region, a pattern or a structure is referred to as "a first", "a second", "a third" and/or "a fourth" one, this is not used for limiting these members but distinguishing layers (or films), regions, patterns or structures from one another. Therefore, the descriptions such as "a first", "a second", "a third" and/or "a fourth", for example, may be selectively or exchangeably used for respective layers (or films), regions, electrodes, patterns or structures.

Organic Thin Film Transistor

Figure 1:
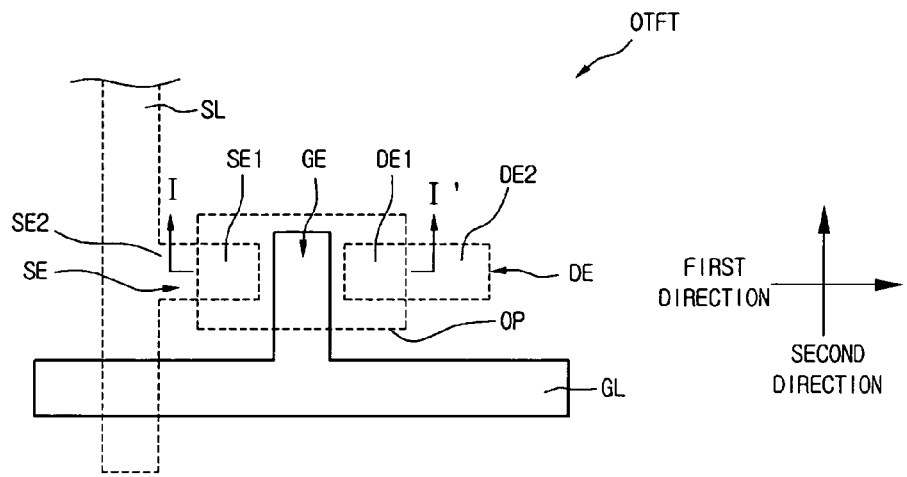
FIG. 1 is a plan view illustrating an organic thin film transistor (OTFT) according to one embodiment of the present invention.
Figure 2:
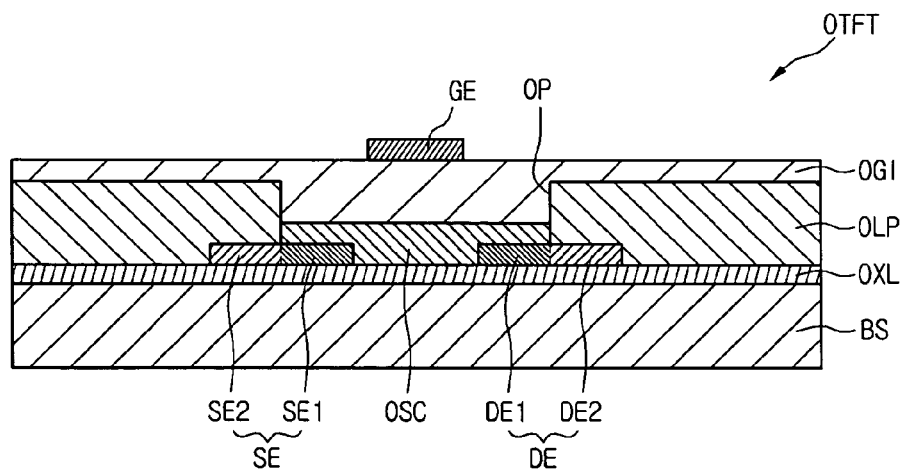
FIG. 2 is a cross-sectional view taken along a line I-I' in FIG. 1.

FIG. 1 is a plan view illustrating an organic thin film transistor (OTFT) according to one embodiment of the present invention, and FIG. 2 is a cross-sectional view taken along a line I-I' in FIG. 1.

Referring to FIGS. 1 and 2, the organic thin film transistor (OTFT) includes an oxide layer OXL, a source electrode SE, a drain electrode DE, a hydrophobic organic layer pattern OLP, a hydrophilic organic semiconductor pattern OSC, a gate insulating layer OGI, and a gate electrode GE branched off from a gate line GL.

The OTFT according to one embodiment of the present invention is formed on a base substrate BS. In this embodiment, the base substrate BS may include a glass substrate or a flexible substrate, and the base substrate may have a light transmittance index which is substantially equal to that of glass.

The oxide layer OXL is formed on the surface of the base substrate BS. The oxide layer OXL may be formed of silicon oxide layer or silicon nitride layer, etc., and the oxide layer OXL may have a hydrophilic property.

The source electrode SE is disposed on the oxide layer OXL. Examples of a material that may be used as the source electrode may include aluminum, aluminum alloy, gold, silver, copper, etc.

The source electrode SE may include a first source electrode portion SE 1 and a second electrode portion SE2. In this embodiment, the second source electrode portion SE2 has a hydrophobic property and the first source electrode portion SE1 temporarily has a hydrophilic property when an organic semiconductor pattern OSC described later is formed on the first source electrode portion SE1. In this embodiment, the first source electrode portion SE1 may have the hydrophilic property for about two hours to about three hours.

In a plan view, about one half of total area of the source electrode SE is the first source electrode portion SE1, and the other half of the source electrode SE is the second source electrode portion SE2.

In this embodiment, the first source electrode portion SE1 is located close to the drain electrode DE, whereas the second source electrode portion SE2 is located relatively far from the drain electrode DE in comparison with the first source electrode portion SE1.

The drain electrode DE is on the oxide layer OXL. In this embodiment, the drain electrode DE may be disposed such that it is coplanar with the source electrode SE, wherein the drain electrode DE is spaced apart from the source electrode SE by a predetermined interval.

In this embodiment, examples of a material that may be used as the drain electrode DE may include aluminum, aluminum alloy, gold, silver, copper, etc. Preferably, the drain electrode DE may be formed of the same material as the source electrode SE.

The drain electrode DE may include a first drain electrode portion DE1 and a second drain electrode portion DE2. In this embodiment, the second drain electrode portion DE2 may have a hydrophobic property, whereas the first drain electrode portion DE1 temporarily has a hydrophilic property when the organic semiconductor pattern OSC described later is formed on the first drain electrode portion DE1.

In this embodiment, the first drain electrode portion DE1 of the drain electrode DE is disposed opposite to the first source electrode portion SE1 of the source electrode SE, in a plan view.

Therefore, the source and drain electrodes SE and DE are disposed in parallel to each other in a plan view.

In this embodiment, the first source electrode portion SE1, the second source electrode portion SE2, the first drain electrode portion DE1 and the second drain electrode portion DE2, are arranged on the oxide layer OXL from left to right in FIG. 2 in the above-listed sequence.

The hydrophilic organic semiconductor pattern OSC, which has a conductive property or an insulating property corresponding to a voltage level applied from an exterior may include a semiconductor material such as silicon or the like.

In this embodiment, the organic semiconductor pattern OSC may have a hydrophilic property. Thus, the organic semiconductor pattern OSC selectively does not adhere to the second source electrode portion SE2 and the second drain electrode portion DE2, whereas it selectively adheres to the first source electrode portion SE1 of the source electrode SE and the first drain electrode portion DE1 of the drain electrode DE. Therefore, the first source electrode portion SE1 and the first drain electrode portion DE1 are electrically connected to each other through the organic semiconductor pattern OSC, wherein the organic semiconductor pattern OSC has an island shape in a plan view. That is, the organic semiconductor pattern OSC is electrically connected to the source electrode SE and the drain electrode DE by a self-align method.

Meanwhile, in order to divide the source electrode SE into the first source electrode portion SE1 and the second source electrode portion SE2, divide the drain electrode DE into the first drain electrode portion DE2 and the second drain electrode portion DE1, and electrically connect the organic semiconductor pattern OSC to the first source electrode SE1 and the first drain electrode DE1, the organic layer pattern OLP may be formed on the base substrate BS.

In this embodiment, the organic layer pattern OLP may have a hydrophobic property. For example, the organic layer pattern OLP may include an acryl-based synthetic resin. In addition, the organic layer pattern OLP may additionally include a photosensitive substance in order that it may be patterned by photolithographic process and development process. Alternatively, the organic layer pattern OLP may be formed by dry etching using plasma or the like.

In the fourth embodiment, the organic layer pattern OLP has an opening OP that exposes the first source electrode portion SE1 of the source electrode SE and the first drain electrode portion DE1 of the drain electrode DE. On the contrary, the second source electrode portion SE2 of the source electrode SE and the second drain electrode portion DE2 of the drain electrode DE may be covered by the organic layer pattern OLP.

The hydrophilic semiconductor material of the organic semiconductor pattern OSC adheres to neither the surface of the organic layer pattern OLP nor the sidewalls of the opening OP of the organic layer pattern OLP by means of the organic layer pattern OLP having the hydrophobic property, but it can adhere to the first source electrode portion SE1 and the first drain electrode portion DE1 temporarily having the hydrophilic properties.

The gate insulating layer OGI may be formed on the top face of the gate organic layer pattern OLP so as to cover the organic semiconductor pattern OSC.

The gate electrode GE may be formed on the gate insulating layer OGI. Particularly, the gate electrode GE may be formed on a predetermined portion of the gate insulating layer OGI corresponding to the organic semiconductor pattern OSC.

Method of Manufacturing OTFT

FIGS. 3 to 9 are cross-sectional views illustrating a method of manufacturing an OTFT according to one embodiment of the present invention.

Figure 3:
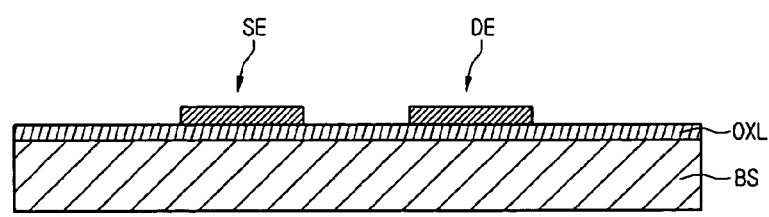
FIGS. 3 to 9 are cross-sectional views illustrating a method of manufacturing the OTFT according to one embodiment of the present invention.

FIG. 3 is a cross-sectional view illustrating a process of forming source and drain electrodes of the OTFT according to one embodiment of the present invention.

Referring to FIG. 3, an oxide layer OXL is formed on an entire top face of a base substrate BS such as a glass substrate or a flexible substrate. In this embodiment, the oxide layer OXL may be formed on the entire top face of the base substrate BS by a CVD process or the like. Alternatively, a nitride layer may be formed on the top face of the base substrate BS instead of the oxide layer OXL, or a double layer including both the oxide layer OXL and the nitride layer may be formed on the top face of the base substrate BS. In this embodiment, a silicon oxide layer may be used as the oxide layer, and a silicon nitride layer may be used as a nitride layer.

After forming the oxide layer OXL on the top face of the base substrate BS, a metal layer (not shown) may be formed on the oxide layer OXL. The metal layer may be formed by a CVD process or a sputtering process.

After forming the metal layer, a photoresist film (not shown) may be formed on the metal layer by spin coating process or slit coating process.

After forming the photoresist film on the metal layer, the photoresist film is partially exposed through an exposure process, and it is then developed so that a photoresist pattern is formed on the metal layer. The photoresist pattern is located where the metal layer should be protected.

After forming the photoresist pattern on the metal layer, the metal layer is etched using the photoresist pattern as an etching mask to thereby form a source electrode SE and a drain electrode DE, respectively.

In this embodiment, a data line (not shown) may be simultaneously formed while forming the source electrode SE, wherein the source electrode SE and the data line are perpendicular to each other in a plan view.

Meanwhile, the drain electrode DE is parallel to the source electrode SE, wherein the drain electrode DE is spaced apart from the source electrode SE by a predetermined distance.

Figure 4:
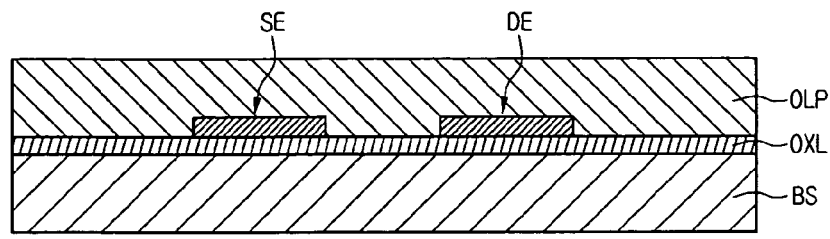

FIG. 4 is a cross-sectional view illustrating a process of forming an organic layer covering the source and drain electrodes illustrated in FIG. 3.

Referring to FIG. 4, after forming the sources and drain electrodes SE and DE on the oxide layer OXL, an organic layer OLP is formed on the oxide layer OXL, the source electrode SE, and the drain electrode DE. In this embodiment, the organic layer OLP be formed on the oxide layer OXL by spin coating process or slit coating process, etc. The organic layer OLP may include an acryl-based synthetic resin and a photosensitive substance for patterning the organic layer OLP.

Figure 5:
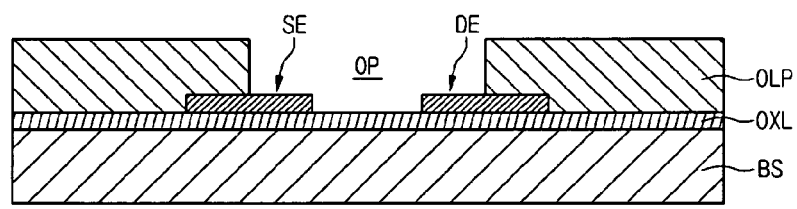

FIG. 5 is a cross-sectional view illustrating a process of forming an organic layer pattern OLP having an opening therein exposing portions of the source and drain electrodes.

Referring to FIG. 5, in order to expose portions of the source and drain electrodes SE and DE from the organic layer, the organic layer having the photosensitive substance is exposed to a light, and it is then developed by a development solution. Thus, an opening OP is formed in the organic layer pattern OLP exposing the portions of the source and drain electrodes SE and DE.

Figure 6:
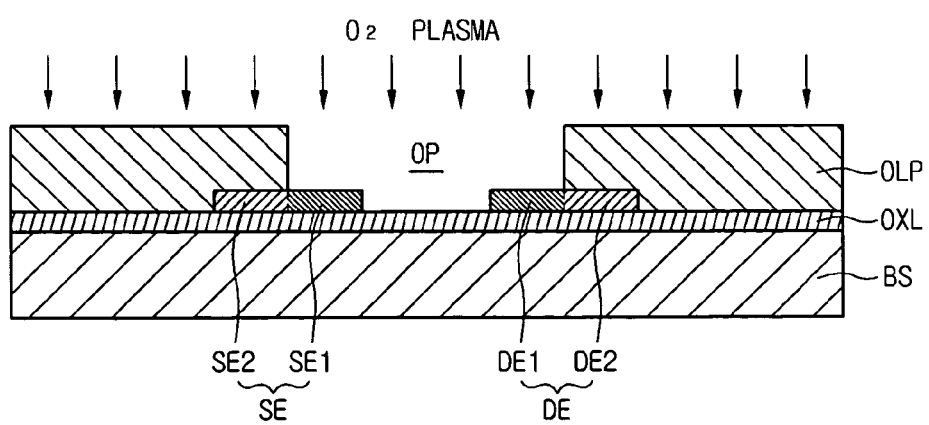

FIG. 6 is a cross-sectional view illustrating a process of an oxygen plasma treatment of the organic layer pattern and the inside of the opening OP illustrated in FIG. 5.

Referring to FIG. 6, after forming the organic layer pattern OLP having the opening OP, the base substrate BS is treated with an oxygen (O₂) plasma streaming in a vertical direction toward the base substrate 10 as shown.

A portion of the source electrode SE, a portion of the drain electrode DE, and a portion of the oxide layer OXL are all treated by oxygen plasma.

Thus, the source electrode SE is divided into a first source electrode portion SE1 and a second source electrode portion SE2, and the drain electrode DE is divided into a first drain electrode portion DE1 and a second drain electrode portion DE2.

Figure 7:
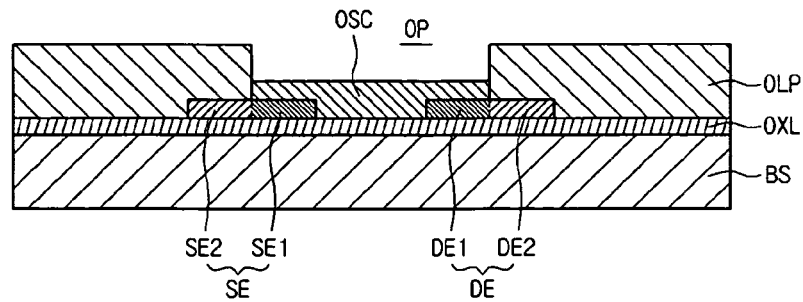

FIG. 7 is a cross-sectional view illustrating a process of forming an organic semiconductor pattern on the first source electrode portion of the source electrode and the first drain electrode portion of the drain electrode illustrated in FIG. 6.

Referring to FIG. 7, after forming the first source electrode portion SE1 in the source electrode SE and the first drain electrode portion DE1 in the drain electrode DE by an oxygen plasma treatment, a hydrophilic organic semiconductor material is provided on the top face of the organic layer pattern OLP. In this embodiment, the fluid hydrophilic organic semiconductor material may have a conductive property or an insulating property depending on an applied electric field.

Because it is difficult for the hydrophilic organic semiconductor material to adhere to the hydrophobic organic layer pattern OLP but the hydrophilic organic semiconductor material can easily adhere to the first source electrode portion SE1 and the first drain electrode portion DE1, the organic semiconductor material fills in the opening OP of the organic layer pattern OLP, and the organic semiconductor material accumulated in the opening OP is hardened so as to form the organic semiconductor pattern OSC.

Figure 8:
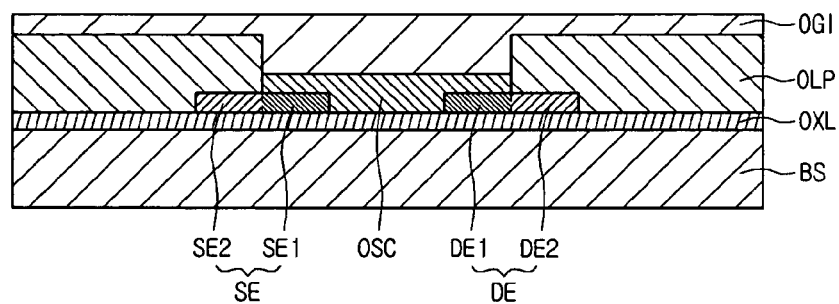

FIG. 8 is a cross-sectional view illustrating a process of forming a gate insulating layer covering the organic semiconductor pattern illustrated in FIG. 7.

Referring to FIG. 8, after forming the organic semiconductor pattern OSC, the gate insulating layer OGI is formed on the organic layer pattern OLP and the organic semiconductor pattern OSC to insulate the organic semiconductor pattern OSC. In this embodiment, the gate insulating layer OGI may include an organic material. When forming the gate insulating layer of the organic material, the gate insulating layer may be formed by spin coating process or slit coating process.

Figure 9:
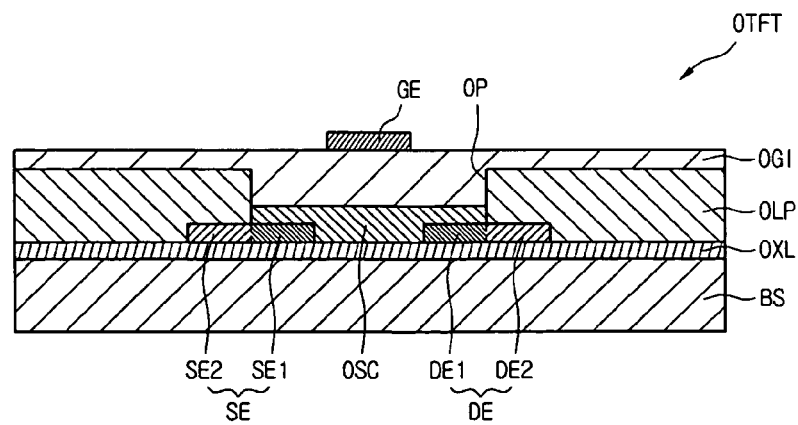

FIG. 9 is a cross-sectional view illustrating a process of forming a gate electrode on the gate insulating layer illustrated in FIG. 8.

Referring to FIG. 9, after forming the gate insulating layer OGI on the organic layer pattern OLP and the organic semiconductor pattern OSC, a gate metal layer and a photoresist film are formed on the entire surface of the gate insulating layer OGI. Subsequently, the photoresist film is patterned by a photolithographic etching process so as to form a photoresist pattern. Afterwards, the gate metal layer is etched using the photoresist pattern as an etching mask to thereby form the gate electrode GE on the gate insulating layer OGI.

Display Device

Figure 10:
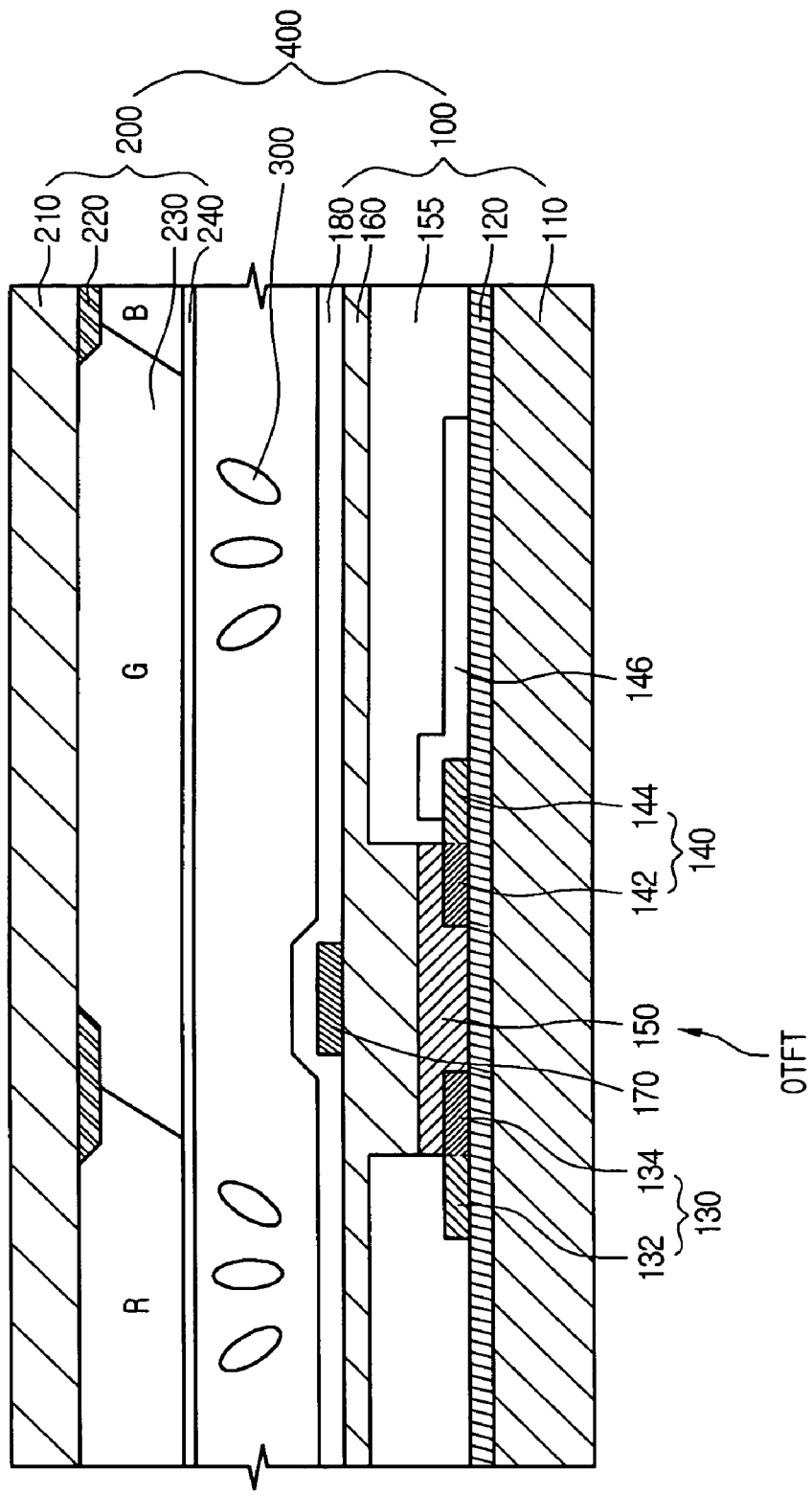
FIG. 10 is a cross-sectional view of a display device according to one embodiment of the present invention.

FIG. 10 is a cross-sectional view illustrating a display device according to one embodiment of the present invention.

Referring to FIG. 10, the display device 400 of the present invention includes a first display substrate 100, a second display substrate 200 and a liquid crystal layer 300 interposed therebetween.

The first display substrate 100 includes an OTFT and a pixel electrode 146.

The OTFT includes an oxide layer 120, a source electrode 130, a drain electrode 140, a hydrophobic organic, layer pattern 155, a hydrophilic organic semiconductor pattern 150, a gate insulating layer 160, and a gate electrode 170.

The OTFT is formed on a first base substrate 110. In this embodiment, the first base substrate 110 includes a transparent substrate such as a glass substrate or a plastic substrate, etc.

The oxide layer 120 is disposed on one side of the first base substrate 110, wherein the oxide layer 120 may be formed of silicon oxide or silicon nitride.

The source electrode 130 is formed on the oxide layer 120. The source electrode 130, for example, may be formed of aluminum, aluminum alloy, gold, silver, copper, etc.

The source electrode 130 includes a first source electrode portion 134 and a second source electrode portion 132. In this embodiment, the first source electrode portion 134 has a hydrophobic property, whereas the second source electrode portion 132 has a hydrophilic property. About one half of total area of the source electrode 130 is the first source electrode portion 134, and the other half of the source electrode 130 is the second source electrode portion 132.

The drain electrode 140 is on the oxide layer 120. In this embodiment, the drain electrode 140 is disposed such that it is coplanar with the source electrode 130, wherein the drain electrode 140 is spaced apart from the source electrode 130 by a predetermined distance.

In this embodiment, a material for used in the drain electrode 140, for example, may be aluminum, aluminum alloy, gold, silver, copper, etc.

The drain electrode 140 includes a first drain electrode portion 142 and a second drain electrode portion 144. In this embodiment, the first drain electrode portion 142 has a hydrophobic property, whereas the second drain electrode portion 144 has a hydrophilic property.

Therefore, the source and drain electrodes 130 and 140 are disposed in parallel to each other in a plan view. As a result, the first source electrode portion 134, the second source electrode portion 132, the first drain electrode portion 142 and the second drain electrode portion 144 are arranged on the oxide layer 120 from left to right in FIG. 10.

The hydrophilic organic semiconductor pattern 150, which has a conductive property or an insulating property depending on an applied electric field, may include a semiconductor material such as silicon or the like.

In this embodiment, the organic semiconductor pattern 150 has a hydrophilic property. Accordingly, the organic semiconductor pattern 150 having the hydrophilic property does not adhere to the second source electrode portion 132 and the second drain electrode portion 144, whereas it adheres to the first source electrode portion 134 of the source electrode 130 and the first drain electrode portion 142 of the drain electrode 140. Therefore, the first source electrode portion 134 and the first drain electrode portion 142 are electrically connected to each other through the organic semiconductor pattern 150, wherein the organic semiconductor pattern 150 has an island shape in a plan view.

Meanwhile, in order to divide the source electrode 130 into the second source electrode portion 132 and the first source electrode portion 134, divide the drain electrode 140 into the second drain electrode portion 144 and first drain electrode portion 142, and electrically connect the organic semiconductor pattern 150 to the first source electrode portion 134 and the first drain electrode portion 142, an organic layer pattern 155 may be formed on the first base substrate 110.

In this embodiment, the organic layer pattern 155 may have a hydrophobic property. For example, the organic layer pattern 155 may include an acryl-based synthetic resin. In addition, the organic layer pattern 155 may additionally include a photosensitive substance so that it may be patterned by photolithographic process and development process.

The organic layer pattern 155 has an opening that exposes the first source electrode portion 134 of the source electrode 130 and the first drain electrode portion 142 of the drain electrode 140. On the contrary, the second source electrode portion 132 of the source electrode 130 and the second drain electrode portion 144 of the drain electrode 140 are shielded by the organic layer pattern 155.

The hydrophilic semiconductor material of the organic semiconductor pattern 150 does not adhere to the surface of the organic layer pattern 155 and the sidewalls of the opening of the organic layer pattern 155 because the organic layer pattern 155 has the hydrophobic property, but it is adheres to the hydrophilic portion, i.e., the first source electrode portion 134 and the first drain electrode portion 142.

The gate insulating layer 160 is formed on the top surface of the organic layer pattern 155 to cover the organic semiconductor pattern 150.

The gate electrode 170 is formed on the gate insulating layer 160. That is, the gate electrode 170 is formed on a predetermined portion of the gate insulating layer 160 corresponding to the organic semiconductor pattern 150.

Thereafter, an alignment film 180 in which alignment grooves are formed is disposed over the gate electrode 170.

The pixel electrode 146 is electrically connected to the first drain electrode portion 144 of the drain electrode 140 of the OTFT. In this embodiment, the pixel electrode 146 may include a transparent conductive oxide such as indium tin oxide (ITO), indium zinc oxide, amorphous-indium tin oxide (a-ITO), or the like.

The first display substrate 100 having the OTFT and the pixel electrode 146 is disposed opposite to the second display device 200. In this embodiment, the second display substrate 200 includes a lattice-shaped blocking pattern 220 and color filters 230 formed thereon. In this embodiment, the blocking pattern 220 may be formed of chromium and/or chromium oxide or black resin that has a light absorption rate is similar to that of chromium.

Edges of the first and second display substrates 100 and 200 are sealed off by a sealing member, and thus, a liquid crystal layer 300 is disposed in a space formed by the sealing member and the first and second display substrates 100 and 200. For example, there may be disposed a ball spacer or a column spacer for maintaining a cell gap of the liquid crystal layer 300 between the first and second display substrates 100 and 200.

According to the illustration as above, it is possible to manufacture the OTFT by a simpler method, and the structurally stabilized thin film transistor as well.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic thin film transistor (OTFT), the method comprising:

forming an oxide layer on a base substrate;

forming source and drain electrodes on the oxide layer, wherein the source electrode is spaced apart from the drain electrode and exposing a portion of the oxide layer;

forming a organic layer pattern having an opening on the base substrate, the opening exposing portions of the source and drain electrodes and the portion of the oxide layer;

treating the exposed portions of the source and drain electrodes and the potion of the oxide layer by an $O_2$ plasma to form a hydrophilic source electrode portion in the source electrode and a hydrophilic drain electrode portion in the drain electrode;

forming a hydrophilic organic semiconductor pattern electrically connected to hydrophilic source electrode portion and the hydrophilic drain electrode portion through the opening; forming a gate insulating layer covering the hydrophilic organic semiconductor pattern; and forming a gate electrode on a predetermined portion of the gate insulating layer corresponding to the organic semiconductor pattern.

2. The method according to claim 1, wherein the forming of the organic semiconductor pattern includes:

coating a fluid organic semiconductor material on the organic layer pattern so that the organic semiconductor material fills the opening; and hardening the organic semiconductor material to form an organic semiconductor pattern.

3. The method according to claim 1, wherein the organic layer pattern has a photosensitive substance.

4. The method according to claim 1, wherein the organic layer pattern includes an acryl based synthetic resin.

* * * * *